United States Patent
Kim et al.

(10) Patent No.: US 7,453,741 B2
(45) Date of Patent: Nov. 18, 2008

(54) SEMICONDUCTOR DEVICE CARD PROVIDING MULTIPLE WORKING VOLTAGES

(75) Inventors: Sang-Bum Kim, Suwon (KR); Sam-Yong Bahng, Syungnam (KR); Chil-Hee Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 485 days.

(21) Appl. No.: 10/960,733

(22) Filed: Oct. 7, 2004

(65) Prior Publication Data

US 2005/0141317 A1 Jun. 30, 2005

(30) Foreign Application Priority Data

Dec. 31, 2003 (KR) .................. 10-2003-0101270

(51) Int. Cl.
  *G11C 5/14* (2006.01)
(52) U.S. Cl. .................. 365/189.09; 365/226; 327/540
(58) Field of Classification Search ............ 365/189.09, 365/226, 51; 327/540, 541
See application file for complete search history.

(56) References Cited

U.S. PATENT DOCUMENTS

| | | | | |
|---|---|---|---|---|
| 5,289,425 A | | 2/1994 | Horiguchi et al. ............ 365/226 |
| 5,309,399 A | * | 5/1994 | Murotani ................ 365/189.09 |
| 5,329,491 A | | 7/1994 | Brown et al. ................. 365/226 |
| 5,490,117 A | | 2/1996 | Oda et al. .................... 365/226 |
| 5,596,532 A | | 1/1997 | Cernea et al. .......... 365/185.18 |
| 5,612,920 A | | 3/1997 | Tomishima .................. 365/226 |
| 5,714,873 A | * | 2/1998 | Hwang ....................... 323/273 |
| 5,773,901 A | | 6/1998 | Kantner ....................... 307/125 |
| 5,818,781 A | * | 10/1998 | Estakhri et al. ............. 365/226 |
| 5,828,892 A | | 10/1998 | Mizuta .................. 395/750.01 |
| 6,035,357 A | | 3/2000 | Sakaki ........................ 710/102 |
| 6,114,878 A | * | 9/2000 | Loughmiller et al. ........ 326/101 |
| 6,477,090 B2 | * | 11/2002 | Yamaki et al. .......... 365/189.09 |
| 6,744,689 B2 | * | 6/2004 | Itou ............................ 365/228 |
| 7,064,602 B2 | * | 6/2006 | Nguyen ...................... 327/541 |
| 7,068,019 B1 | * | 6/2006 | Chiu .......................... 323/281 |
| 7,170,784 B2 | * | 1/2007 | Cernea et al. .......... 365/185.12 |
| 7,173,854 B2 | * | 2/2007 | Cernea et al. .......... 365/185.12 |
| 7,212,067 B2 | * | 5/2007 | Pasternak ................... 327/541 |

OTHER PUBLICATIONS

European Patent Application No. EP0874327 published on Oct. 28, 1998.
International Publication No. WO 97/20269 published on Jun. 5, 1997.
Japanese Patent Application No. 05-141493 to Kaoru, having Publication date of Dec. 2, 1994 (w/ English Abstract page).
U.S. Patent Publication No. 2003/0004297 to van Osselaer et al., having Publication date of Jan. 2, 2003.
U.S. Patent Publication No. 2003/0151957 to Pekny, having Publication date of Aug. 14, 2003.

* cited by examiner

*Primary Examiner*—VanThu Nguyen
*Assistant Examiner*—Alexander Sofocleous
(74) *Attorney, Agent, or Firm*—Monica H. Choi

(57) ABSTRACT

A semiconductor device card, such as a memory card for example, includes a semiconductor device, a working voltage indicator, and a working voltage generator. A working voltage indicator is set to indicate a desired level of a working voltage corresponding to the semiconductor device. A working voltage generator generates the working voltage having the desired level and being coupled to the semiconductor device. Thus, the semiconductor device card is easily adaptable to accommodate various working voltages of the semiconductor device.

35 Claims, 7 Drawing Sheets

SEMICONDUCTOR DEVICE CARD PROVIDING MULTIPLE WORKING VOLTAGES

CROSS-REFERENCE TO RELATED APPLICATION(S)

The present application claims priority under 35 U.S.C. § 119 to Korean Patent Application No. 2003-0101270, filed on Dec. 31, 2003, which is incorporated herein by reference in its entirety.

TECHNICAL FIELD

The present invention relates generally to semiconductor device cards such as memory cards, and more particularly, to a semiconductor device card capable of providing any of multiple working voltages to a semiconductor device on the card.

BACKGROUND OF THE INVENTION

The present invention is described for a memory card. However, the present invention may in general be used for any type of semiconductor device card.

FIG. 1 shows a memory card 102 of the prior art for transmission of data between a memory device 104 and a host 106. The memory card 102 is inserted into the host 106 that provides a host voltage to the memory card 102. The host voltage from the host 106 is coupled to a memory controller 108 and the memory device 104. In such a manner, such components 104 and 108 of the memory card 102 derive power from the host 106 for operation.

In the prior art, the memory device 104 operates properly when the working voltage of the memory device 104 is substantially same as the host voltage from the host 106. For example, the host 106 and the memory device 104 both operate with a working voltage of 3.3 Volts.

Unfortunately, the prior art memory card 102 cannot be used with a host providing a different host voltage from the working voltage of the memory device 104. Thus, in the prior art, the host 106 operates properly with the memory card 102 when the memory device 104 has a substantially same working voltage as the host voltage. Conversely, the memory device 104 operates properly when interfaced to the host 106 providing substantially the same host voltage as the working voltage of the memory device 104.

Recently, the memory device 104 is designed with lower working voltage such as 1.8 Volts for example for minimizing power dissipation. However, such a memory device 104 with reduced working voltage would not operate properly with a host 106 providing a higher host voltage.

U.S. Pat. No. 5,828,892 to Mizuta (hereafter referred to as "Mizuta") discloses a memory card 11 having a power source voltage control circuit 12 that provides a desired working voltage to an I/O (input/output buffer) 13 and a DRAM (dynamic random access memory) device 14, as illustrated in FIG. 2. The voltage control circuit 12 provides the desired working voltage (such as 3.3 Volts for example) even when the host voltage Vcc is higher (such as 5.0 Volts for example).

FIG. 3 shows the implementation of the voltage control circuit 12 as disclosed in Mizuta. The host voltage is received at an input 28 that is coupled to a first window comparator 21 and a second window comparator 24. The first window comparator 21 turns on a first MOSFET 22 if the host voltage is within a first range of values such as 4.5 Volts to 5.5 Volts. The second window comparator 24 turns on a second MOSFET 25 if the host voltage is within a second range of values such as 3.0 Volts to 3.6 Volts.

The first MOSFET 22 that is turned on couples the host voltage to a DC-DC converter 23 that converts the host voltage in the first range of values down to the working voltage of the DRAM 14 (such as 3.3 Volts for example). Such as stepped down working voltage is generated on an output terminal 29. The second MOSFET 25 that is turned on simply couples the host voltage in the second range of values to the output terminal 29 as the working voltage of the DRAM 14.

Thus, the voltage control circuit 12 provides the working voltage that is lower than or equal to the host voltage. Consequently, the memory card 12 may be used with different types of hosts providing host voltages that are greater than or equal to the working voltage of the DRAM 14.

The memory card 11 of Mizuta accommodates different host voltages to operate with different types of hosts. However, the memory card 11 of Mizuta accommodates a predetermined working voltage of the memory device 14 as the DC-DC converter 23 is fixed for conversion to the predetermined working voltage. With advancement of technology, the working voltage of the memory device 14 may be decreased further and further. Thus, the memory device within a memory card may have one of various working voltages. However, the memory card 11 of Mizuta does not accommodate various working voltages of the memory device 14.

Thus, a memory card that is easily adaptable for various working voltages of the memory device is desired.

SUMMARY OF THE INVENTION

Accordingly, a semiconductor device card such as a memory card in an embodiment of the present invention has a mechanism for accommodating various working voltages of a semiconductor device on the card.

In one embodiment of the present invention, a semiconductor device card includes a semiconductor device, a working voltage indicator, and a working voltage generator. A working voltage indicator is set to indicate a desired level of a working voltage corresponding to the semiconductor device. A working voltage generator generates the working voltage having the desired level and being coupled to the semiconductor device.

In an example embodiment of the present invention, the semiconductor device is a memory device for the semiconductor device card that is a memory card. In that case, the semiconductor device card includes a memory controller having the working voltage generator.

The memory controller includes a data processing device, a host interface, and a memory interface. The data processing device controls data transmission between a host and the memory device. The host interface interfaces the data processing device to the host, and the memory interface interfaces the data processing device to the memory device. A host voltage is applied to the host interface, the data processing device, and the memory interface. The working voltage is applied to the memory interface and the memory device.

In another embodiment of the present invention, the working voltage generator generates the working voltage from the host voltage.

In a further embodiment of the present invention, the working voltage generator includes a feed-back path for maintaining the working voltage substantially at the desired level. For example, the feed-back path includes an output node with the working voltage generated thereon. A switch is coupled between the host voltage and the output node. A comparator compares the working voltage and the desired level to turn on the switch for charging/discharging the output node when the working voltage is not equal to the desired level. A reference voltage generator generates a target voltage having the desired level and being coupled to the comparator.

In a further embodiment of the present invention, the voltage generator includes a plurality of reference voltage generators, each generating a respective target voltage. In that case, the working voltage indicator includes a multiplexer for coupling a selected target voltage having the desired level from one of the reference voltage generators to the comparator.

The working voltage indicator further includes at least one option pin coupled to the multiplexer, and a respective logical state of each option pin is set to indicate the selected target voltage. Alternatively, the working voltage indicator further includes at least one fuse circuit coupled to the multiplexer, and a respective logical state of each output of the fuse circuit is set to indicate the selected target voltage.

In another embodiment of the present invention, the working voltage indicator includes a voltage select decoder that asserts one of a voltage up signal, a voltage down signal, and a voltage pass signal from comparing the host voltage and the working voltage. A first voltage generator generates the working voltage boosted from the host voltage when the voltage up signal is asserted to indicate that the desired level of the working voltage is greater than the host voltage. A second voltage generator generates the working voltage as the host voltage when the voltage pass signal is asserted to indicate that the desired level of the working voltage is substantially equal to the host voltage. A third voltage generator generates the working voltage stepped down from the host voltage when the voltage down signal is asserted to indicate that the desired level of the working voltage is less than the host voltage.

In another embodiment of the present invention, the working voltage indicator includes a variable resistance block coupled to the output node and having a plurality of metal lines with variable coupling for adjusting the working voltage at the output node.

In this manner, the working voltage generator generates the working voltage having the desired level that is any of higher than, lower than, or substantially equal to the host voltage. Thus, the semiconductor device card is easily adaptable to accommodate various working voltages of the semiconductor device.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, and 11 refer to elements having similar structure and function.

DETAILED DESCRIPTION

The present invention is described for a memory card. However, the present invention may in general be used for any type of semiconductor device card.

Figure 1:
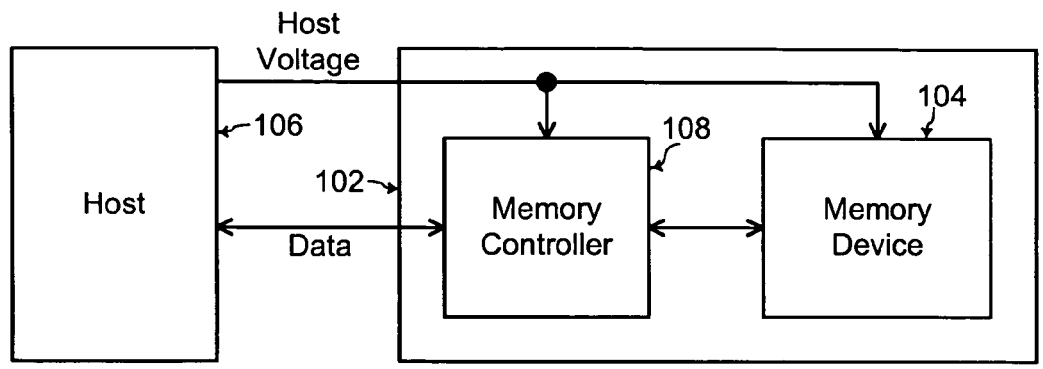
FIG. 1 shows a block diagram of a memory card interfaced to a host, according to the prior art.
Figure 2:
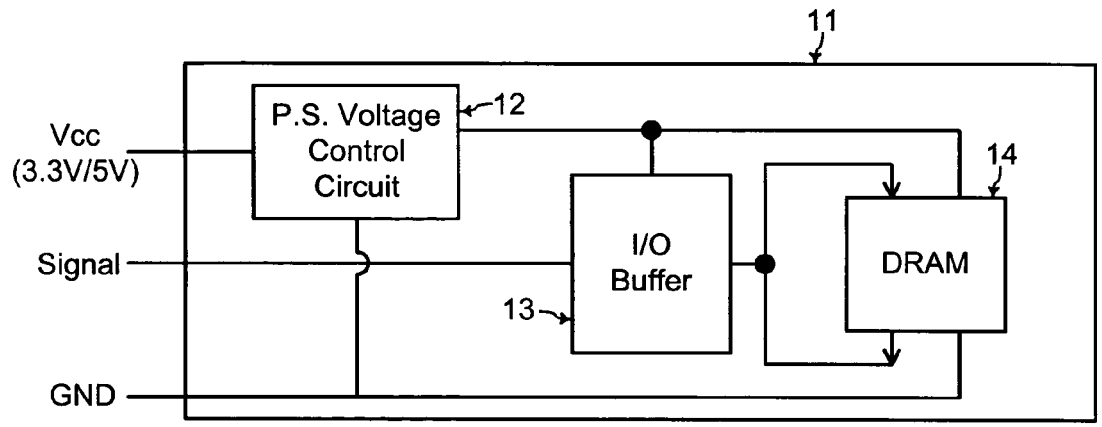
FIG. 2 shows a block diagram of a memory card that accommodates various host voltages, according to the prior art.
Figure 3:
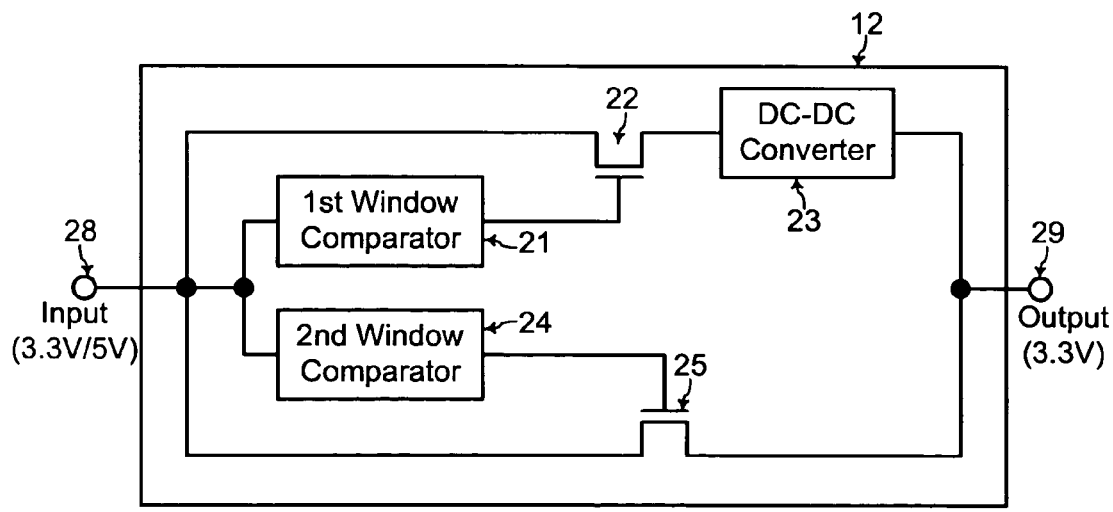
FIG. 3 shows a block diagram of a voltage control circuit of FIG. 2, according to the prior art.
Figure 4:
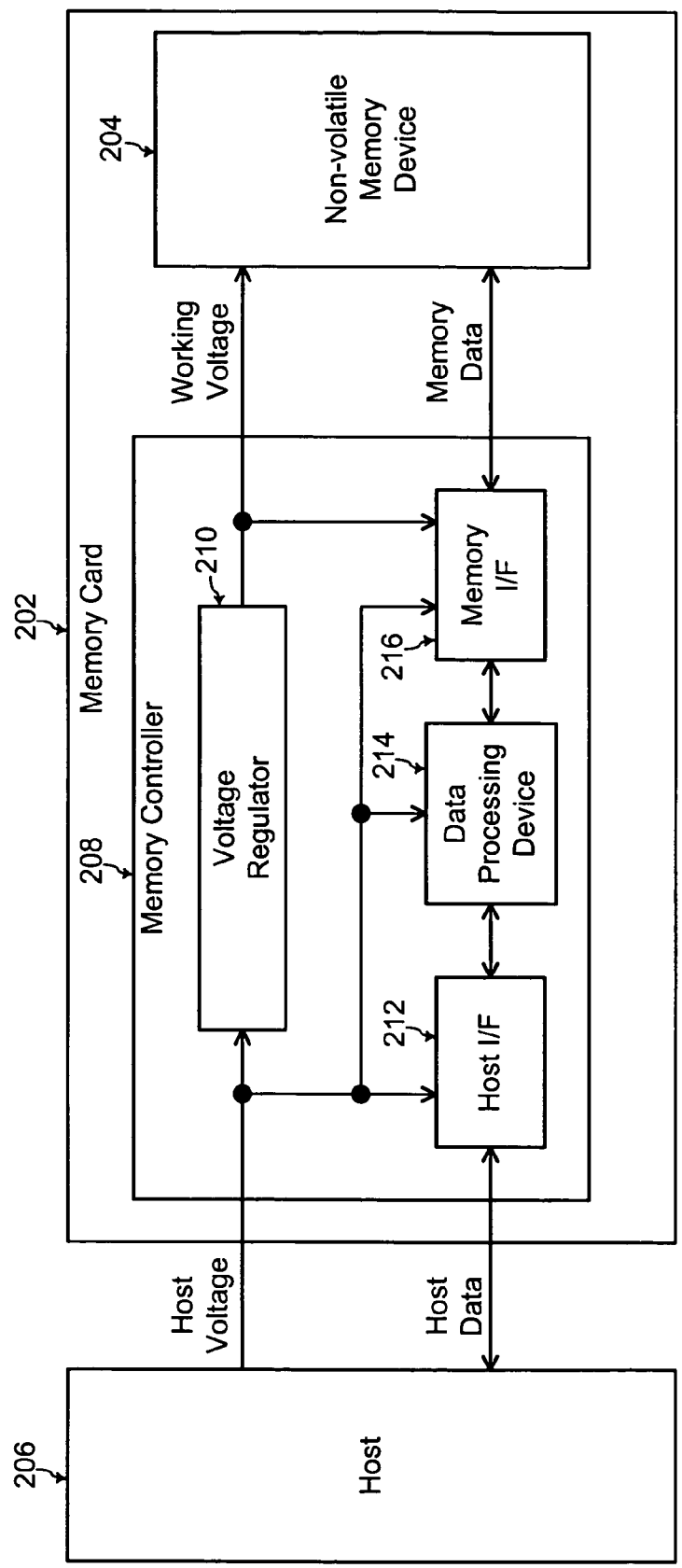
FIG. 4 shows a block diagram of a memory card that is adaptable for accommodating various working voltages of a memory device, according to an embodiment of the present invention.

Referring to FIG. 4, a semiconductor card 202 of an embodiment of the present invention transmits data between a semiconductor device 204 and a host 206. The semiconductor device 204 is a non-volatile memory device such as a flash memory device, an EEPROM (electrically erasable programmable read only memory), a PRAM (phase-change random access memory), a MRAM (magnetic random access memory), or a FRAM (ferro-electric random access memory), in one embodiment of the present invention.

In the case that the memory device 204 is a flash memory device, the memory card 202 is referred to as a "flash card". Such flash cards are of many types such as MMC (multi-media card), SD (security device), CF (contact flash), or memory sticks depending on the manufacturer or the application.

The host 206 that uses the memory card 202 to particular advantage may be common portable devices such as MP3 players, camcorders, digital cameras, PDAs (personal digital assistants), and mobile products. However, the present invention may be practiced when the semiconductor card 202 is for any type of semiconductor device 204 and any type of host 206.

Further referring to FIG. 4, the memory card 202 includes a memory controller 208 with a voltage regulator 210, a host I/F (interface) 212, a data processing device 214, and a memory I/F (interface) 216. The host I/F 212 interfaces the memory controller 208 to the host 206, and the memory I/F 216 interfaces the memory controller 208 to the memory device 204. The data processing device 214 controls operation of the interfaces 212 and 216 for data transmission between the memory device 204 and the host 206.

The voltage regulator 210 receives the host voltage from the host 206 and generates a working voltage coupled to the memory device 204 and the memory I/F 216, in an embodiment of the present invention. The host voltage is coupled to the host I/F 212, the data processing device 214, and the memory I/F 216, in an embodiment of the present invention.

Figure 5:
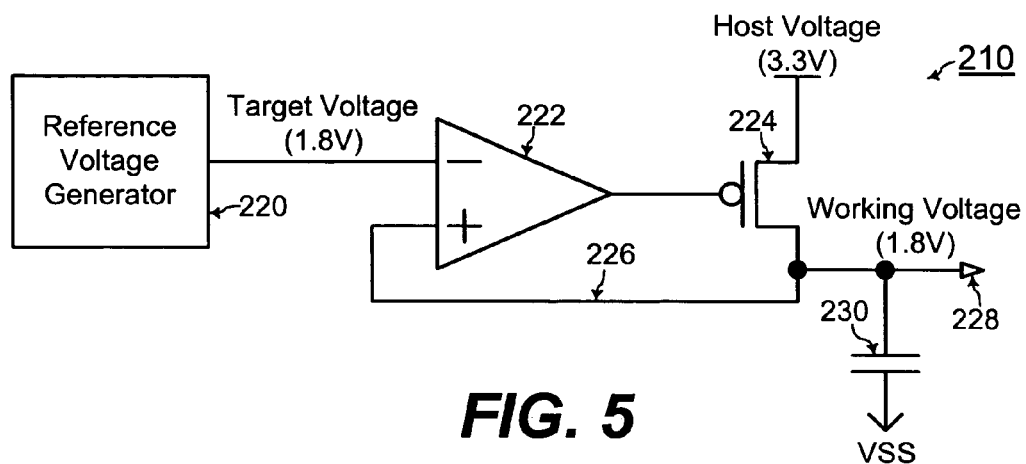
FIG. 5 shows components of a voltage regulator of FIG. 4, according to an embodiment of the present invention.

Referring to FIGS. 4 and 5, the voltage regulator 210 is a working voltage generator in one embodiment of the present invention. In FIG. 5, the voltage regulator 210 includes a reference voltage generator 220 that generates a target voltage coupled to a negative input of a comparator 222. The output of the comparator 222 is coupled to the gate of a PMOSFET 224 having a source coupled to the host voltage from the host 206.

The drain of the PMOSFET 224 is coupled to the positive input of the comparator 222 via a feed-back path 226. The drain of the PMOSFET 224 forms an output node 228 having the working voltage generated thereon. A decoupling capacitor 230 is coupled between the output node 228 and a low voltage source VSS which is a ground node of the host 206 in one embodiment of the present invention.

During operation of the voltage regulator of FIG. 5, the reference voltage generator 220 generates a target voltage that has the desired level (such as 1.8 Volts for example) of the working voltage to be generated at the output node 228. The level of the working voltage generated at the output node 228 is compared to the target voltage from the reference voltage generator 220.

Upon power-up, if the level of the working voltage is less than the target voltage, the PMOSFET 224 is turned on by the negative output of the comparator 222 to charge up the output node 228 for increasing the working voltage. When the working voltage at the output node 228 reaches the target voltage, the positive output of the comparator 222 turns off the PMOSFET 224.

In this manner, the feed-back path 226 maintains the working voltage at the output node 228 to be substantially equal to the target voltage from the reference voltage generator 220. Thus, the working voltage supplied to the memory device 204 has the desired level for any host voltage (such as 3.3 Volts in FIG. 5 for example) greater than the desired level of the working voltage.

Figure 6:
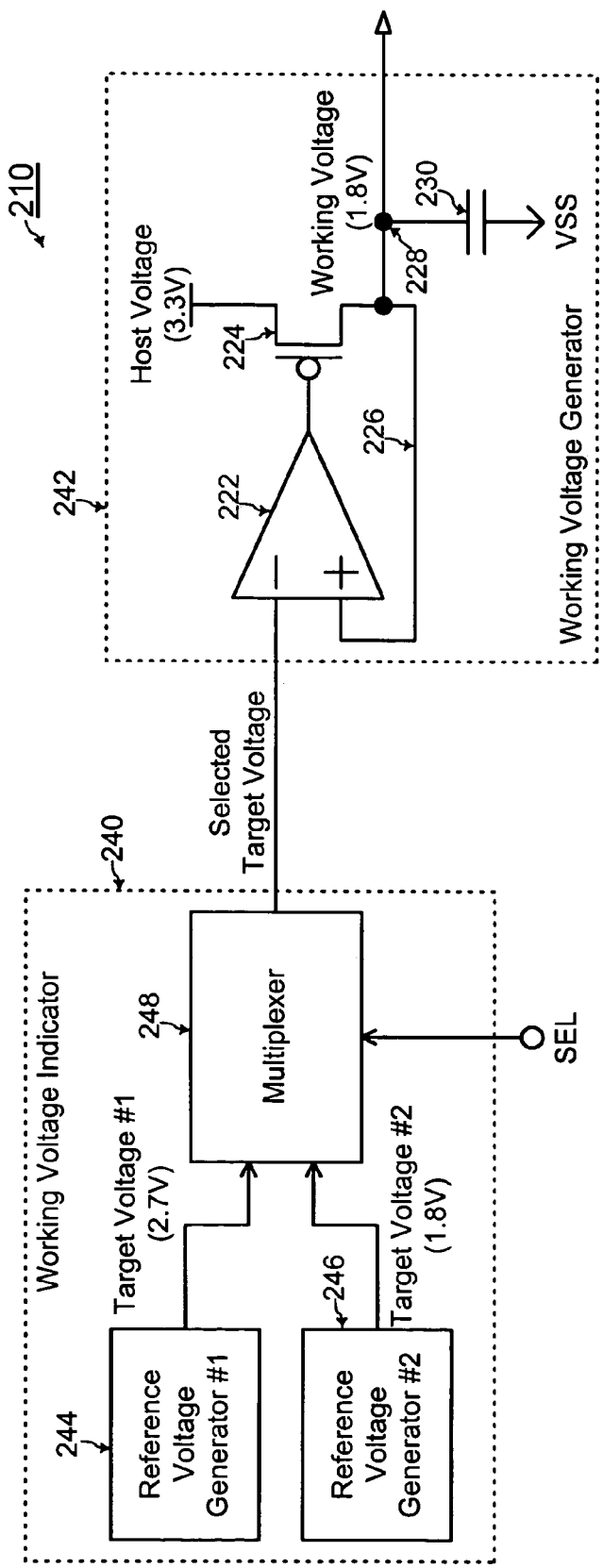
FIG. 6 shows an alternative voltage regulator of FIG. 4 with components for accommodating two possible working voltages of the memory device, according to an embodiment of the present invention.

FIG. 6 shows an alternative embodiment of the voltage regulator 210 including a working voltage indicator 240 and a working voltage generator 242. The working voltage indicator 240 includes a first reference voltage generator 244 for generating a first target voltage with a first level (2.7 Volts for example). The working voltage indicator 240 includes a second reference voltage generator 246 for generating a second target voltage with a second level (1.8 Volts for example).

The working voltage indicator 240 further includes a multiplexer 248 that inputs the target voltages from the first and second reference voltage generators 244 and 246. A select signal SEL is input to the multiplexer that selects one of the target voltages from the first and second reference voltage generators 244 and 246 as a selected target voltage coupled to the negative input of the comparator 222.

The working voltage generator 242 of FIG. 6 operates similarly with that of FIG. 5 to generate the working voltage at the output node 228 having the desired level of the selected target voltage from the multiplexer 248. In this manner, the working voltage indicator 240 of FIG. 6 allows for flexibility in the working voltage of the memory device 204. With such a working voltage indicator 240, the desired level of the working voltage used by the memory device 204 may vary between the two target voltages from the reference voltage generators 244 and 246.

Figure 7:
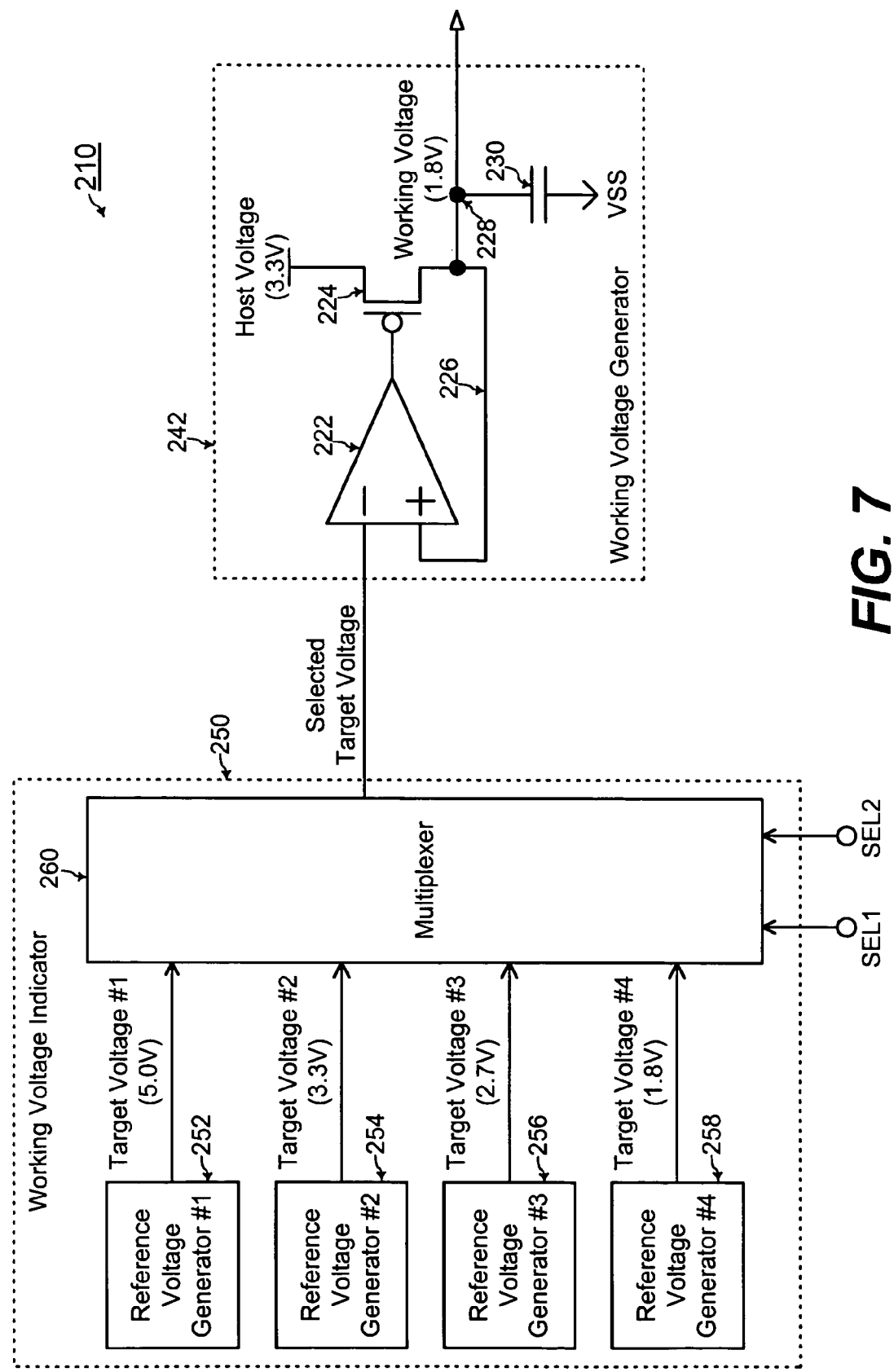
FIG. 7 shows an alternative voltage regulator of FIG. 4 with components for accommodating four possible working voltages of the memory device, according to an embodiment of the present invention.

FIG. 7 shows another embodiment of the voltage regulator 210 having the working voltage generator 242 similar to that in FIG. 6. A working voltage indicator 250 of FIG. 7 includes first, second, third, and fourth reference voltage generators 252, 254, 256, and 258, respectively. Each of the reference voltage generators 252, 254, 256, and 258 generates a respective target voltage, such as 5.0 Volts, 3.3 Volts, 2.7 Volts, and 1.8 Volts, respectively, for example.

Such target voltages from the reference voltage generators 252, 254, 256, and 258 are input by a multiplexer 260 that selects one of such target voltages as a selected target voltage coupled to the negative input of the comparator 222. The multiplexer 260 selects one of the target voltages from the reference voltage generators 252, 254, 256, and 258 depending on the respective logical state of each of two select signals SEL1 and SEL2.

The working voltage generator 242 of FIG. 7 operates similarly with that of FIG. 6 to generate the working voltage at the output node 228 having the desired level of the selected target voltage from the multiplexer 260. In this manner, the working voltage indicator 250 of FIG. 7 allows for flexibility in the working voltage of the memory device 204. With such a working voltage indicator 250, the desired level of the working voltage used by the memory device 204 may vary between the four target voltages from the reference voltage generators 252, 254, 256, and 258.

Figure 8:
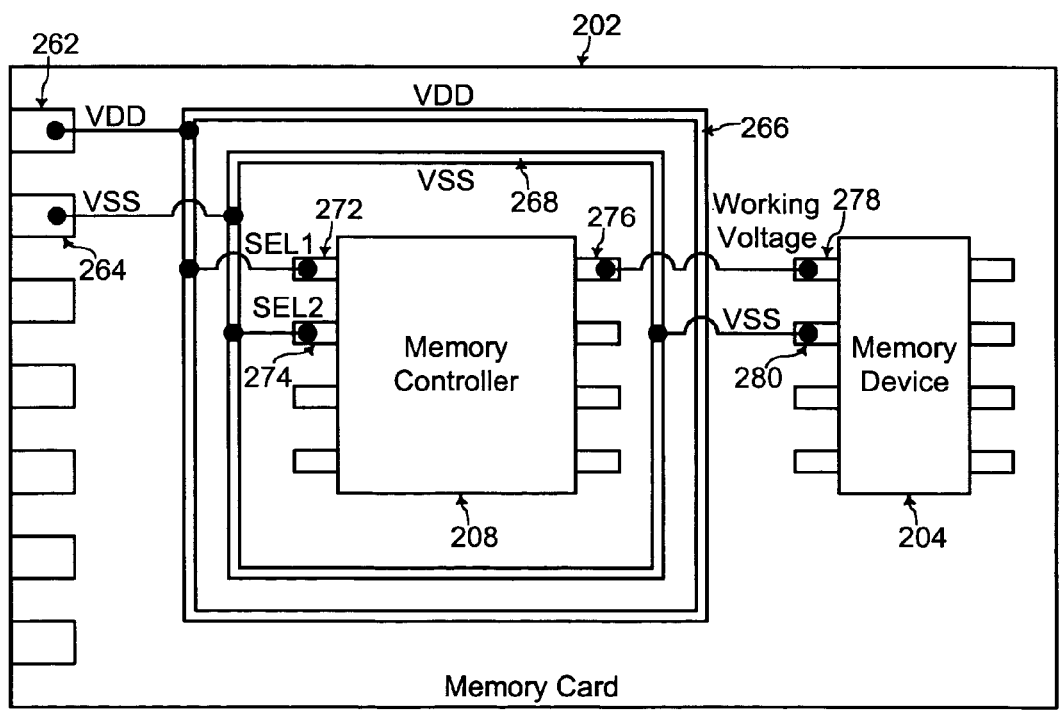
FIG. 8 illustrates option pins each having a respective logical state set to indicate a desired level of the working voltage in FIG. 7, according to an embodiment of the present invention.

FIG. 8 illustrates an example mechanism for setting the respective logical state of each of the select signals SEL1 and SEL2 in FIG. 7. Referring to FIG. 8, the memory card 202 includes a first IC (integrated circuit) package of the memory controller 208 and includes a second IC package of the memory device 204. The memory card 202 includes a plurality of contact pads such as a first contact pad 262 coupled to the host voltage VDD and a second contact pad 264 coupled to the host ground VSS.

A host voltage line 266 coupled to the first contact pad 262 and a host ground line 268 coupled to the second contact pad 264 are formed around the memory controller 208. A first pin 272 of the memory controller 208 has the first select signal SEL1 applied thereon and is coupled to one of the host voltage line 266 and the host ground line 268. If the first pin 272 is coupled to the host voltage line 266, the first select signal SEL1 has a logical high state. If the first pin 272 is coupled to the host ground line 268, the first select signal SEL1 has a logical low state.

Similarly, a second pin 274 of the memory controller 208 has the second select signal SEL2 applied thereon and is coupled to one of the host voltage line 266 and the host ground line 268. If the second pin 274 is coupled to the host voltage line 266, the second select signal SEL2 has a logical high state. If the second pin 274 is coupled to the host ground line 268, the second select signal SEL2 has a logical low state.

Referring to FIGS. 7 and 8, during manufacture of the memory card 202, the first and second pins 272 and 274 are each coupled to one of the lines 266 and 268 such that the multiplexer 260 selects one of the four target voltages from the reference voltage generators 252, 254, 256, and 258 corresponding to the desired level of the working voltage of the memory device 204. In this manner, the first and second pins 272 and 274 are set with a respective logical state as part of the working voltage indicator 250 for indicating the desired level of the working voltage of the memory device 204.

Further referring to FIG. 8, the working voltage generated on the output node 228 is applied on a third pin 276 of the memory controller 208 that is coupled to a working voltage pin 278 of the memory device 204. A ground pin 280 of the memory device 204 is coupled to the host ground line 268 such that the working voltage on the working voltage pin 278 is with respect to the host ground VSS, in one embodiment of the present invention.

Referring to FIGS. 6 and 8, just one pin such as the first pin 272 of the memory controller 208 may be used for having the select signal SEL of the multiplexer 248 applied thereon. In that case, the first pin 272 is coupled to one of the lines 266 and 268 for setting the logical state of the select signal SEL in FIG. 6.

Figure 9:
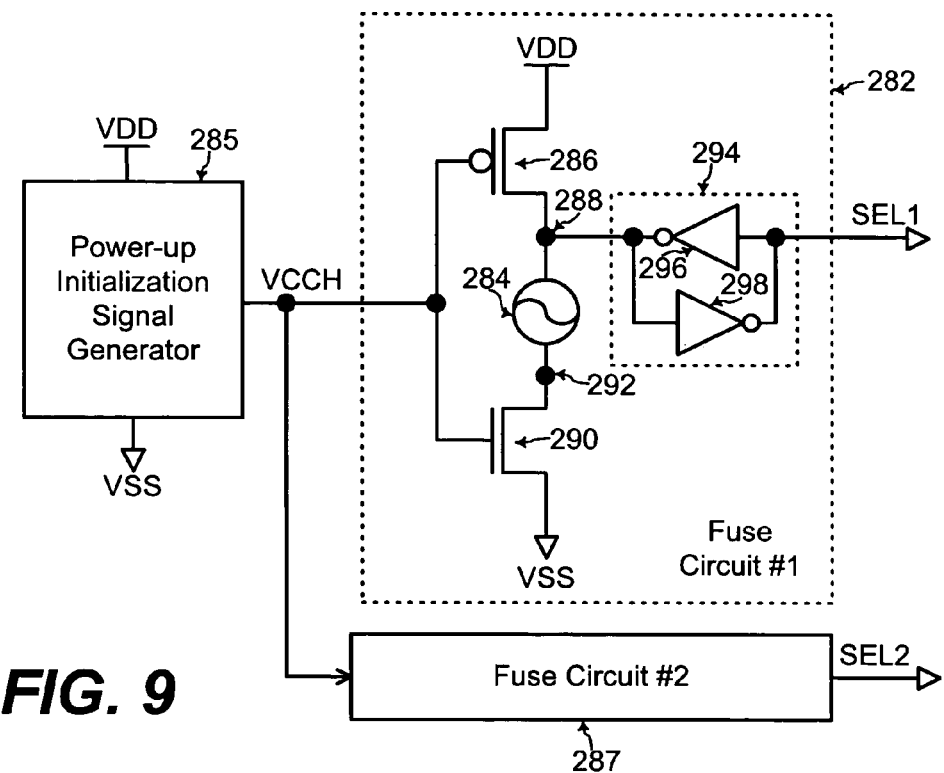
FIG. 9 illustrates fuse circuits each having an output with a respective logical state set to indicate a desired level of the working voltage in FIG. 7, according to another embodiment of the present invention.

FIG. 9 shows another mechanism for setting the respective logical state of each of the select signals SEL1 and SEL2 in FIG. 7. FIG. 9 shows a first fuse circuit 282 and a second fuse circuit 287 coupled to a power-up initialization signal generator 285 coupled between the host voltage VDD and the host ground VSS. Upon power up, the initialization signal generator 285 generates a biasing voltage VCCH with a logical high state.

The first fuse circuit 282 includes a fuse 284 coupled to a drain of a PMOSFET 286 at a first node 288. The PMOSFET 228 has a source coupled to the host voltage VDD and a gate having the VCCH bias applied thereon. An NMOSFET 290 has a drain coupled to a second node 292 of the fuse 284, a source coupled to the host ground node VSS, and a gate having the VCCH bias applied thereon.

The first fuse circuit 282 also includes a latch 294 of a loop of inverters 296 and 298 coupled to the first node 288 of the fuse 284. The output of the latch 294 generates the first select signal SEL1. During operation of the first fuse circuit 282, when the fuse 284 is cut to be open-circuited, the SELL signal is a logical low state. Alternatively, when the fuse 284 is not cut, the SEL1 signal is a logical high state.

The fuse 284 of the first fuse circuit 282 is cut or left not cut for setting the logical state of the SEL1 signal. The second fuse circuit 287 is similar to the first fuse circuit 282 with another fuse within the second fuse circuit 287 that is cut or left not cut for setting the logical state of the SEL2 signal.

Referring to FIGS. 7 and 9, during manufacture of the memory card 202, the respective fuse within each of the first and second fuse circuits 282 and 287 is cut or left not cut such that the multiplexer 260 selects one of the four target voltages from the reference voltage generators 252, 254, 256, and 258 corresponding to the desired level of the working voltage of the memory device 204. In this manner, the respective fuse within each of the first and second fuse circuits 282 and 287 is set as part of the working voltage indicator 250 for indicating the desired level of the working voltage of the memory device 204.

Figure 10:
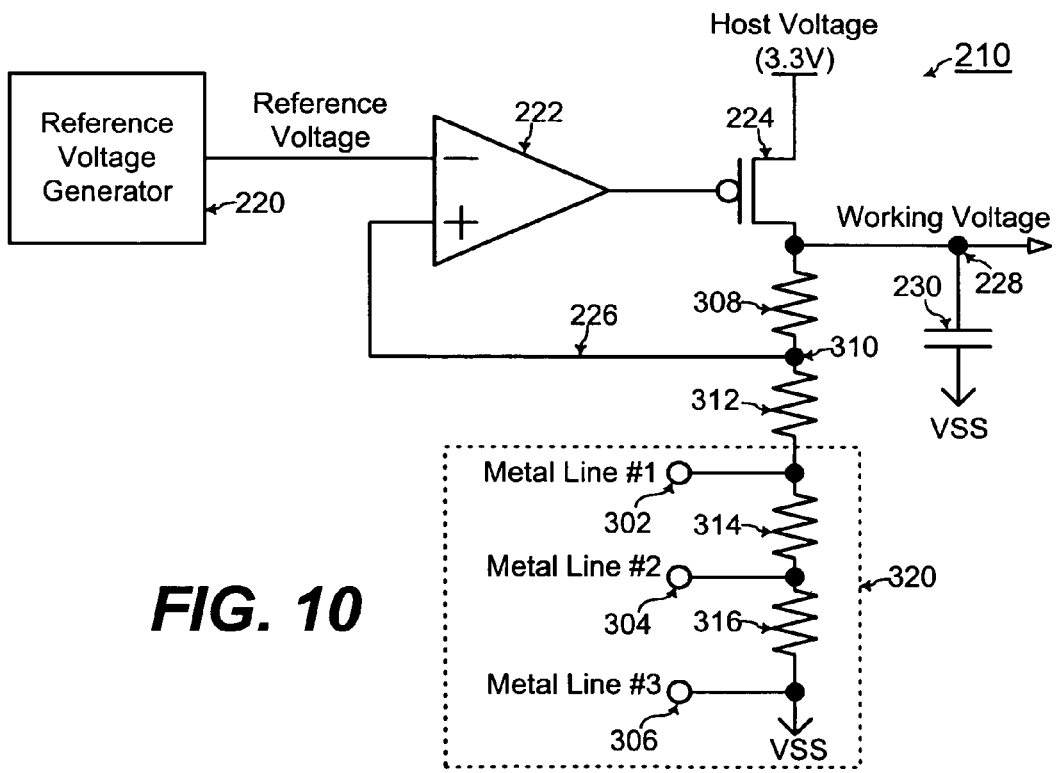
FIG. 10 illustrates a voltage regulator of FIG. 4 with a variable resistance block for providing an adjustable working voltage, according to an embodiment of the present invention.

FIG. 10 shows an alternative embodiment of the voltage regulator 210 with a working voltage generated at the output node 228. The level of such a working voltage is adjustable with variable coupling of a plurality of metal lines 302, 304, and 306 within a variable resistance block 320. Elements having the same reference number in FIGS. 5 and 10 refer to elements having similar structure and function.

In FIG. 10 however, a plurality of resistors are coupled from the drain of the PMOSFET 224. A first resistor 308 is coupled between the drain of the PMOSFET 224 and a feed-back path node 310. A second resistor 310 is coupled between the feed-back path node 310 and a first metal line 302. A third resistor 314 is coupled between the first metal line 302 and a second metal line 304. A fourth resistor 316 is coupled between the second metal line 304 and a third metal line 306 which is also coupled to the host ground VSS.

Any of the metal lines 302, 304, and 306 may be coupled together to vary the resistance of the variable resistance block 320. For example, if the first metal line 302 is connected to the third metal line 306, the resistance through the resistance block 320 is zero. If the second metal line 304 is connected to the third metal line 306, the resistance through the resistance block 320 is the resistance of the third resistor 314. If the first metal line 302 is connected to the second metal line 304, the resistance through the resistance block 320 is the resistance of the fourth resistor 316.

In any case, a voltage substantially similar to the reference voltage generated by the reference voltage generator 220 is generated at the feed-back path node 310. By varying the resistance of the resistance block 320, a variable level of current flows through the resistors 308, 312, 314, and 316. With such a variable level of current, the working voltage generated at the output node 228 may be varied. In this manner, the connection of the metal lines 302, 304, and 306 is varied for adjusting the level of the working voltage generated at the output node 228. Thus, the voltage regulator 210 of FIG. 10 allows for flexibility in the working voltage of the memory device 204.

Figure 11:
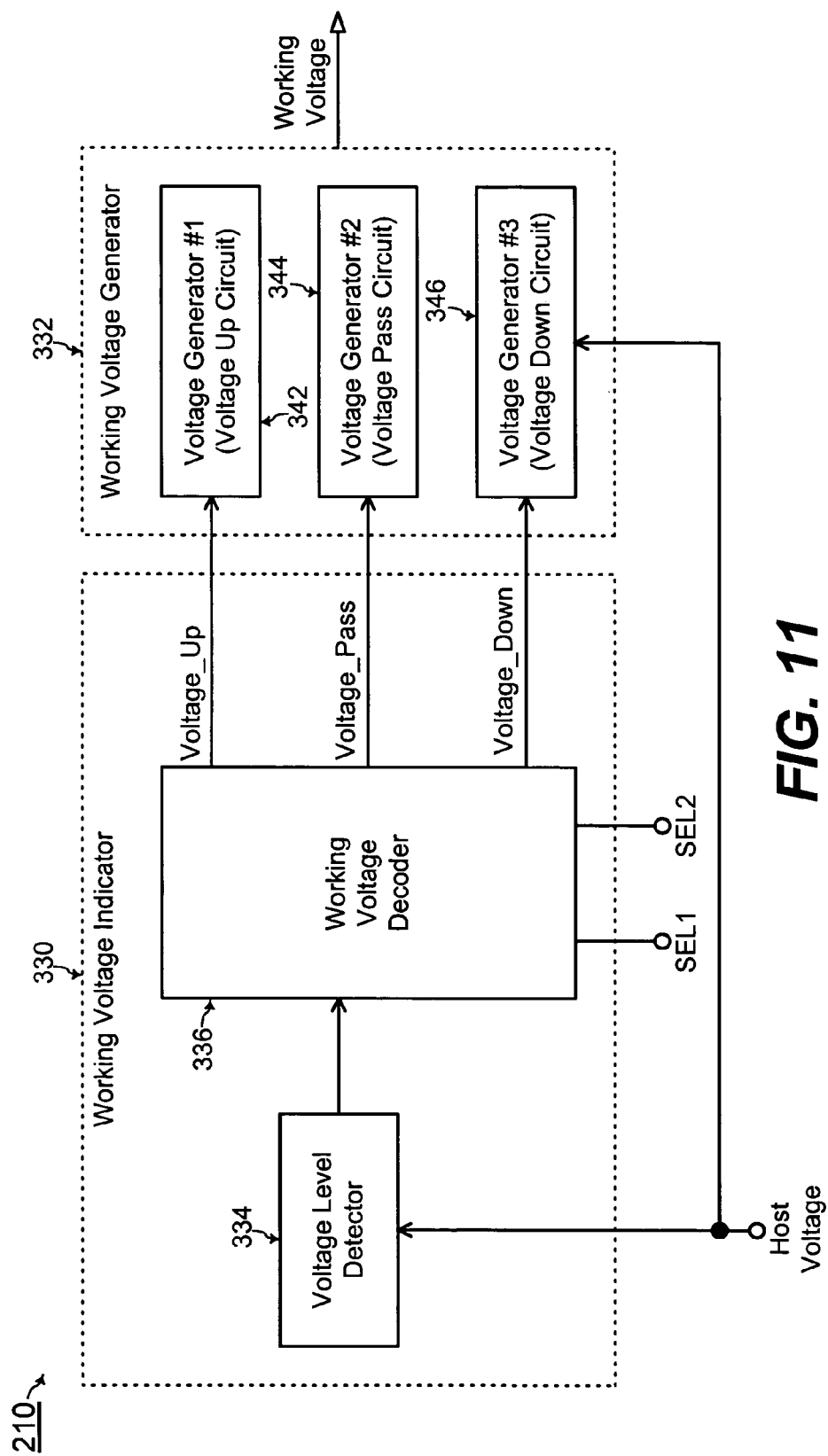
FIG. 11 illustrates a voltage regulator of FIG. 4 that generates the working voltage that is any of greater than, substantially equal to, or less than the host voltage, according to another embodiment of the present invention.

FIG. 11 shows an alternative embodiment of the voltage regulator 210 having a working voltage indicator 330 and a working voltage generator 332. The working voltage indicator includes a host voltage level detector 334 and a working voltage decoder 336. The host voltage level detector 334 indicates the level of the host voltage VDD to the working voltage decoder 336.

The working voltage decoder 336 inputs first and second select signals SEL1 and SEL2 each having a respective logical state for indicating a desired level of the working voltage of the memory device 204. The first and second select signals SEL1 and SEL2 may be generated as described in reference to FIG. 8 or 9. The working voltage decoder 336 compares the level of the host voltage VDD and the desired level of the working voltage of the memory device 204 and asserts one of a voltage up signal, a voltage pass signal, and a voltage down signal.

The working voltage decoder 336 asserts the voltage up signal if the desired level of the working voltage is greater than the level of the host voltage VDD. Alternatively, the working voltage decoder 336 asserts the voltage pass signal if the desired level of the working voltage is substantially equal to the level of the host voltage VDD. Finally, working voltage decoder 336 asserts the voltage down signal if the desired level of the working voltage is less than the level of the host voltage VDD.

The working voltage generator includes first, second, and third voltage generators 342, 344, and 346, respectively. One of such voltage generators is activated depending on which of the voltage up signal, the voltage pass signal, or the voltage down signal is asserted from the working voltage decoder 336.

If the voltage up signal is asserted, the first voltage generator 342 (i.e., a voltage up circuit) is activated for generating the working voltage boosted from the host voltage. Alternatively, if the voltage pass signal is asserted, the second voltage generator 344 (i.e., a voltage pass circuit) is activated for generating the working voltage as the host voltage.

Finally, if the voltage down signal is asserted, the third voltage generator 346 (i.e., a voltage down circuit) is activated for generating the working voltage that is stepped down from the host voltage. In this manner, the voltage regulator 210 of FIG. 11 allows for the desired level of the working voltage of the memory device 204 to be any of greater than, substantially equal to, or less than the level of the host voltage.

The foregoing is by way of example only and is not intended to be limiting. For example, the present invention has been described in reference to the memory device 204 for the memory card 202. However, the present invention may be used for generating the working voltage of any other type of semiconductor device on any other type of semiconductor device card. In addition, any number of elements illustrated and described herein are by way of example only. Furthermore, any values of voltages illustrated and described herein are by way of example only. For example, a negative host voltage with an NMOSFET may be used for discharging the output node 228 to a negative working voltage in the voltage regulator 210 of FIG. 5.

The present invention is limited only as defined in the following claims and equivalents thereof.

The invention claimed is:

1. A semiconductor device card comprising:
   a semiconductor device;
   a working voltage indicator that is set to indicate a desired level of a working voltage corresponding to the semiconductor device; and
   a working voltage generator for generating the working voltage having said desired level and being coupled to the semiconductor device, wherein the voltage generator further includes:
   a plurality of reference voltage generators, each generating a respective target voltage;
   and wherein the working voltage indicator includes:
   a multiplexer for coupling a selected target voltage indicating the desired level from one of the reference voltage generators to the working voltage generator; and
   at least one option pin coupled to the multiplexer, wherein each option pin is fixedly connected to a respective voltage source that continuously maintains a respective voltage at a respective constant level durina operation of the semiconductor device for permanently indicatmnn the selected target voltage.

2. The semiconductor device card of claim 1, wherein the semiconductor device is a memory device for the semiconductor device card that is a memory card.

3. The semiconductor device card of claim 2, wherein the memory device is non-volatile.

4. The semiconductor device card of claim 2, further comprising:
   a memory controller including the working voltage generator.

5. The semiconductor device card of claim 4, wherein the memory controller further includes:
   a data processing device for controlling data transmission between a host and the memory device;
   a host interface for interfacing the data processing device to the host; and
   a memory interface for interfacing the data processing device to the memory device;
   wherein a host voltage is applied to the host interface, the data processing device, and the memory interface;
   and wherein the working voltage is applied to the memory interface and the memory device.

6. The semiconductor device card of claim 1, wherein the working voltage generator generates the working voltage from a host voltage.

7. The semiconductor device card of claim 1, wherein the working voltage generator includes:
   a feed-back path for maintaining the working voltage substantially at said desired level.

8. The semiconductor device card of claim 7, wherein the feed-back path includes:
   an output node with the working voltage generated thereon;
   a switch coupled between a voltage source and the output node; and
   a comparator for comparing the working voltage and the desired level to turn on the switch for charging/discharging the output node when the working voltage is not equal to the desired level.

9. The semiconductor device card of claim 8, wherein the voltage generator further includes:
   a decoupling capacitor coupled to the output node.

10. The semiconductor device card of claim 8, wherein the voltage source is a host providing a host voltage.

11. The semiconductor device card of claim 1, wherein the working voltage indicator further includes:
   a respective fuse circuit set for fixedly coupling the respective one of the first and second voltages to each option pin.

12. A semiconductor device card comprising:
   a semiconductor device;
   a working voltage indicator that is set to indicate a desired level of a working voltage corresponding to the semiconductor device;
   a working voltage generator for generating the working voltage having said desired level and being coupled to the semiconductor device, wherein the voltage generator further includes:
   a plurality of reference voltage generators, each generating a respective target voltage;
   and wherein the working voltage indicator includes:
   a multiplexer for coupling a selected target voltage indicating the desired level from one of the reference voltage generators to the working voltage generator; and
   at least one option pin coupled to the multiplexer, wherein each option pin is fixedly coupled to a respective one of a first voltage for a logical high state or a second voltage for a logical low state for fixedly indicating the selected target voltage;
   a first contact pad having the first voltage applied thereon;
   a second contact pad having the second voltage applied thereon;
   a host voltage line connected to the first contact pad; and
   a host ground line connected to the second contact pad;
   wherein each option pin is connected to a respective one of the host voltage line and the host ground line such that the selected target voltage is fixedly indicated.

13. The semiconductor device card of claim 12, wherein the semiconductor device is a memory device for the semiconductor device card that is a memory card.

14. The semiconductor device card of claim 13, wherein the memory device is non-volatile.

15. The semiconductor device card of claim 13, further comprising:
   a memory controller including the working voltage generator.

16. The semiconductor device card of claim 15, wherein the memory controller further includes:
   a data processing device for controlling data transmission between a host and the memory device;
   a host interface for interfacing the data processing device to the host; and
   a memory interface for interfacing the data processing device to the memory device;
   wherein a host voltage is applied to the host interface, the data processing device, and the memory interface;
   and wherein the working voltage is applied to the memory interface and the memory device.

17. The semiconductor device card of claim 12, wherein the working voltage generator generates the working voltage from a host voltage.

18. The semiconductor device card of claim 12, wherein at least one of the working voltage generators includes:
   a feed-back path for maintaining the working voltage substantially at said desired level.

19. The semiconductor device card of claim 18, wherein the feed-back path includes:
   an output node with the working voltage generated thereon;
   a switch coupled between a voltage source and the output node; and
   a comparator for comparing the working voltage and the desired level to turn on the switch for charging/discharging the output node when the working voltage is not equal to the desired level.

20. The semiconductor device card of claim 19, wherein the at least one of the voltage generators further includes:
   a reference voltage generator for generating a target voltage having said desired level and being coupled to said comparator.

21. The semiconductor device card of claim 19, wherein the at least one of the voltage generators further includes:
   a decoupling capacitor coupled to the output node.

22. The semiconductor device card of claim 19, wherein the voltage source is a host providing a host voltage.

23. A semiconductor device card comprising:
   a semiconductor device;
   a working voltage indicator that is set to indicate a desired level of a working voltage corresponding to the semiconductor device; and
   a working voltage generator for generating the working voltage having said desired level and being coupled to the semiconductor device;
   wherein the working voltage indicator includes:
   a voltage select decoder that asserts one of a voltage up signal, a voltage down signal, and a voltage pass signal from comparing a host voltage and the working voltage;
   and wherein the working voltage generator includes:
   a first voltage generator for generating the working voltage boosted from the host voltage when the voltage up signal is asserted to indicate that the desired level of the working voltage is greater than the host voltage;
   a second voltage generator for generating the working voltage as the host voltage when the voltage pass signal is asserted to indicate that the desired level of the working voltage is substantially equal to the host voltage; and
   a third voltage generator for generating the working voltage stepped down from the host voltage when the voltage down signal is asserted to indicate that the desired level of the working voltage is less than the host voltage.

24. The semiconductor device card of claim 23, wherein the working voltage indicator further includes:
   at least one option pin coupled to the voltage select decoder, wherein a respective logical state of each option pin is set to indicate the desired level of the working voltage.

25. The semiconductor device card of claim 23 wherein the working voltage indicator further includes:
   at least one fuse circuit coupled to the voltage select decoder, wherein a respective logical state of each output of the fuse circuit is set to indicate the desired level of the working voltage.

26. The semiconductor device card of claim 23, wherein the semiconductor device is a memory device for the semiconductor device card that is a memory card.

27. The semiconductor device card of claim 26, wherein the memory device is non-volatile.

28. The semiconductor device card of claim 26, further comprising:
   a memory controller including the working voltage generator.

29. The semiconductor device card of claim 28, wherein the memory controller further includes:
   a data processing device for controlling data transmission between a host and the memory device;
   a host interface for interfacing the data processing device to the host; and
   a memory interface for interfacing the data processing device to the memory device;
   wherein a host voltage is applied to the host interface, the data processing device, and the memory interface;
   and wherein the working voltage is applied to the memory interface and the memory device.

30. The semiconductor device card of claim 23, wherein the working voltage generator generates the working voltage from a host voltage.

31. The semiconductor device card of claim 23, wherein at least one of the working voltage generators includes:
   a feed-back path for maintaining the working voltage substantially at said desired level.

32. The semiconductor device card of claim 31, wherein the feed-back path includes:
   an output node with the working voltage generated thereon;
   a switch coupled between a voltage source and the output node; and
   a comparator for comparing the working voltage and the desired level to turn on the switch for charging/discharging the output node when the working voltage is not equal to the desired level.

33. The semiconductor device card of claim 32, wherein the at least one of the voltage generators further includes:
   a reference voltage generator for generating a target voltage having said desired level and being coupled to said comparator.

34. The semiconductor device card of claim 32, wherein the at least one of the voltage generators further includes:
   a decoupling capacitor coupled to the output node.

35. The semiconductor device card of claim 32, wherein the voltage source is a host providing a host voltage.

* * * * *